(12) United States Patent
Shimamura et al.

(10) Patent No.: US 9,456,488 B2
(45) Date of Patent: Sep. 27, 2016

(54) CIRCUIT MODULE AND METHOD OF PRODUCING CIRCUIT MODULE

(71) Applicant: Taiyo Yuden Co., Ltd., Tokyo (JP)

(72) Inventors: Masaya Shimamura, Tokyo (JP); Takehiko Kai, Tokyo (JP); Eiji Mugiya, Tokyo (JP); Tetsuo Saji, Tokyo (JP); Hiroshi Nakamura, Tokyo (JP)

(73) Assignee: TAIYO YUDEN CO., LTD. (JP)

( * ) Notice: Subject to any disclaimer, the term of this patent is extended or adjusted under 35 U.S.C. 154(b) by 0 days.

(21) Appl. No.: 14/090,445

(22) Filed: Nov. 26, 2013

(65) Prior Publication Data

US 2015/0070849 A1 Mar. 12, 2015

(30) Foreign Application Priority Data

Sep. 12, 2013 (JP) ................. 2013-189248

(51) Int. Cl.
*H05K 1/02* (2006.01)
*H05K 3/28* (2006.01)
(Continued)

(52) U.S. Cl.
CPC ........... *H05K 1/0216* (2013.01); *H01L 21/561* (2013.01); *H01L 23/3135* (2013.01); *H01L 23/552* (2013.01); *H01L 24/97* (2013.01); *H05K 1/0269* (2013.01); *H05K 3/284* (2013.01); *H05K 5/065* (2013.01); *H05K 9/0037* (2013.01); *H05K 9/0083* (2013.01); *H01L 2224/16225* (2013.01); *H01L 2224/97* (2013.01); *H01L 2924/12042* (2013.01); *H01L 2924/15159* (2013.01); *H01L 2924/181* (2013.01);
(Continued)

(58) Field of Classification Search
CPC .. G06F 1/182; H05K 9/0016; H05K 9/0062; H05K 1/0218; H01L 23/552
See application file for complete search history.

(56) References Cited

U.S. PATENT DOCUMENTS 6,235,985 B1 * 5/2001 Dai ...................... H05K 1/0218
174/359
7,259,041 B2 * 8/2007 Stelzl ..................... H01L 21/561
257/659

(Continued)

FOREIGN PATENT DOCUMENTS

JP 2004-095607 A 3/2004
JP 2005-317935 A 11/2005

(Continued)

OTHER PUBLICATIONS

Office Action issued in corresponding Japanese Application No. 2013-191365 dated Nov. 26, 2013 and English translation of the same (5 pages).

*Primary Examiner* — Xanthia C Cunningham
(74) *Attorney, Agent, or Firm* — Fitch Even Tabin & Flannery LLP

(57) ABSTRACT

There is provided a circuit module including a circuit substrate having a mount surface; a mount component mounted on the mount surface; a sealing body formed on the mount surface, the sealing body covering the mount component and having a trench formed from a main surface of the sealing body to the mount surface; and a shield having an inner shield section formed within the trench and an outer shield section that covers the sealing body and the inner shield section, the outer shield section including a first section having a flat surface formed on the main surface of the shielding body and a second section formed on the inner shield section and protruded or sagged from the first section.

5 Claims, 11 Drawing Sheets

(51) Int. Cl.
  *H05K 9/00* (2006.01)
  *H05K 5/06* (2006.01)
  *H01L 23/31* (2006.01)
  *H01L 21/56* (2006.01)
  *H01L 23/552* (2006.01)
  *H01L 23/00* (2006.01)

(52) U.S. Cl.
  CPC .. *H01L 2924/19105* (2013.01); *H05K 1/0215* (2013.01); *H05K 2201/09036* (2013.01); *H05K 2201/09145* (2013.01); *H05K 2201/09972* (2013.01); *H05K 2201/1056* (2013.01)

(56) References Cited

U.S. PATENT DOCUMENTS

| | | | | |
|---|---|---|---|---|
| 8,061,012 B2* | 11/2011 | Carey | ............... | H01L 23/552 29/592 |
| 8,922,030 B2* | 12/2014 | Bayerer | ............... | H01L 23/16 257/787 |
| 9,101,044 B2* | 8/2015 | Shimamura | ......... | H01L 23/3121 |
| 2004/0252475 A1 | 12/2004 | Tsuneoka et al. | | |
| 2005/0046001 A1* | 3/2005 | Warner | ............... | G06F 21/10 257/678 |
| 2005/0162841 A1* | 7/2005 | Ogatsu | ............... | H05K 3/284 361/816 |
| 2005/0280937 A1* | 12/2005 | Sasaki | ............... | G11B 5/1278 360/125.06 |
| 2006/0065903 A1* | 3/2006 | Sakurai | ............... | H01L 27/3276 257/82 |
| 2006/0258050 A1* | 11/2006 | Fujiwara | ............... | H01L 23/29 438/112 |
| 2006/0274517 A1* | 12/2006 | Coffy | ............... | H01L 21/561 361/816 |
| 2009/0067149 A1* | 3/2009 | Bogursky | ............ | H01L 23/552 361/816 |
| 2009/0140402 A1* | 6/2009 | Ohtani | ............... | H01L 21/56 257/675 |
| 2010/0110656 A1* | 5/2010 | Ko | ............... | H01L 21/561 361/818 |
| 2010/0157566 A1* | 6/2010 | Bogursky | ............ | H05K 9/0032 361/816 |
| 2011/0038136 A1* | 2/2011 | Carey | ............... | H01L 23/552 361/818 |
| 2012/0008288 A1 | 1/2012 | Tsukamoto et al. | | |
| 2012/0081702 A1* | 4/2012 | Yamada | ............... | G01B 11/306 356/237.5 |
| 2013/0155639 A1* | 6/2013 | Ogawa | ............... | H01L 23/552 361/816 |
| 2013/0294034 A1* | 11/2013 | Kanryo | ............... | H01L 21/561 361/728 |

FOREIGN PATENT DOCUMENTS

| | | |
|---|---|---|
| JP | 2012-019091 A | 1/2012 |
| WO | 2012/093690 A1 | 7/2012 |

* cited by examiner

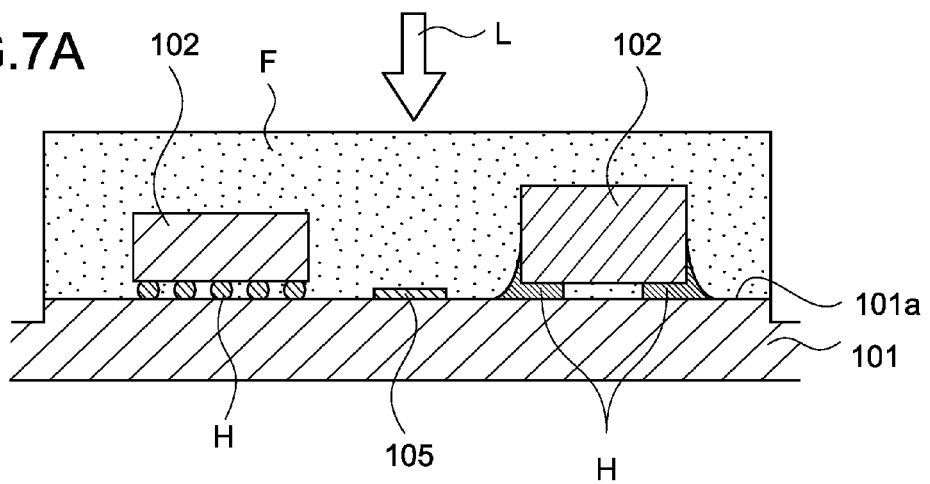
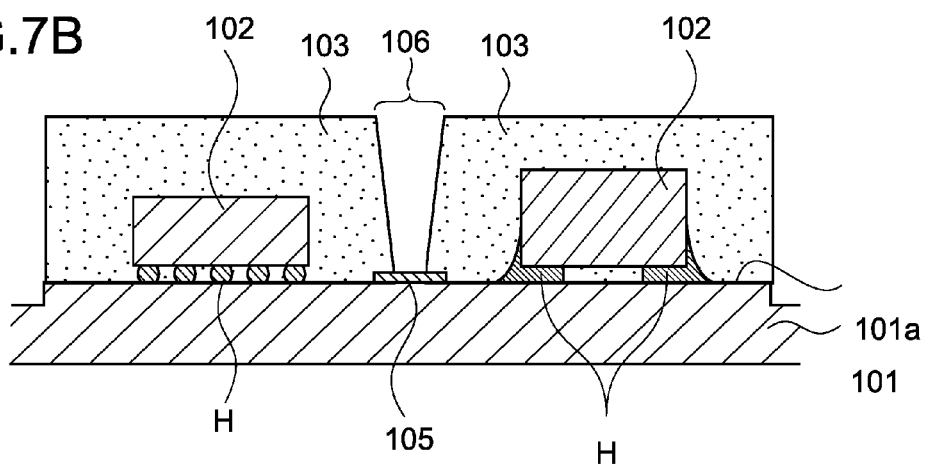
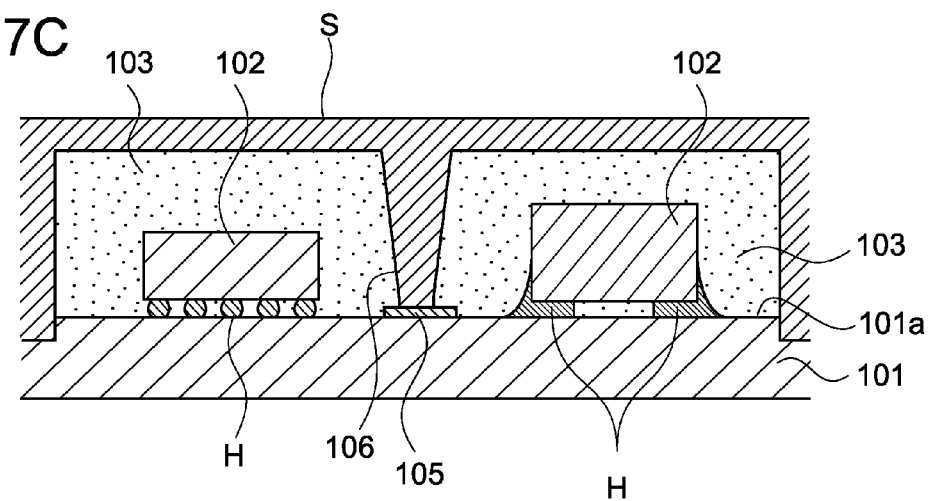

120
CIRCUIT MODULE AND METHOD OF PRODUCING CIRCUIT MODULE

CROSS-REFERENCE TO RELATED APPLICATION

This application claims priority under 35 U.S.C. §119 to Japanese Patent Application No. JP 2013-189248 filed on Sep. 12, 2013, the entire content of which is hereby incorporated herein by reference in its entirety.

FIELD

The present disclosure relates to a circuit module including a circuit substrate on which mount components are mounted and sealed.

BACKGROUND

A known circuit module includes a circuit substrate on which a plurality of mount components are mounted and is mounted to a variety of electronic devices. In general, such a circuit module has a configuration that an electromagnetic shield is formed on a sealing body covering the mount components to prevent an interruption induced by electromagnetic waves (hereinafter referred to as electromagnetic interruption) inside and outside of the module.

In addition, when a plurality of mount components are mounted on the circuit substrate, there is developed a circuit module where the shields are provided to separate the mount components in order to prevent the electromagnetic interruption between the mount components. As the mount components are covered with the sealing bodies as described above, the sealing bodies are partly removed to form trenches (grooves) and the trenches are filled with a conductive material to provide the shields between the mount components.

For example, Japanese Patent Application Laid-open No. 2004-95607 discloses a module component where split grooves are formed on a sealing body covering mount components, and a metal film is formed within the split grooves. The metal film within the split grooves is connected to a ground pattern formed on a circuit substrate and functions as a shield.

SUMMARY

However, after the sealing body is coated with the shield, it is not possible to visually recognize positions of the mount components, a configuration of an inner shield and the like. It may be difficult to visually recognize a direction of the circuit module.

As it is not possible to visually recognize whether or not the inner shield is formed after the shield is formed, it is difficult to confirm whether or not the inner shield (trench) is formed in an inspection before shipping. Thus, it is difficult to exclude defective products formed not by forming the trench that have no inner shield.

In view of the above-described circumstances, it is desirable to provide a circuit module where a direction of the circuit module can be easily recognized and defective products are easily determined.

According to an embodiment of the present disclosure, there is provided a circuit module including a circuit substrate, a mount component, a sealing body, and a shield.

The circuit substrate includes a mount surface.

The mount component is mounted on the mount surface.

The sealing body is formed on the mount surface, covers the mount component and has a trench formed from a main surface of the sealing body to the mount surface.

The shield has an inner shield section formed within the trench and an outer shield section that covers the sealing body and the inner shield section. The outer shield section includes a first section having a flat surface formed on the main surface of the shielding body and a second section formed on the inner shield section and protruded or sagged from the first section.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIGS. 7A to 7C each is a schematic view showing a method of producing the circuit module;

DETAILED DESCRIPTION OF THE EMBODIMENTS

Figure 1:
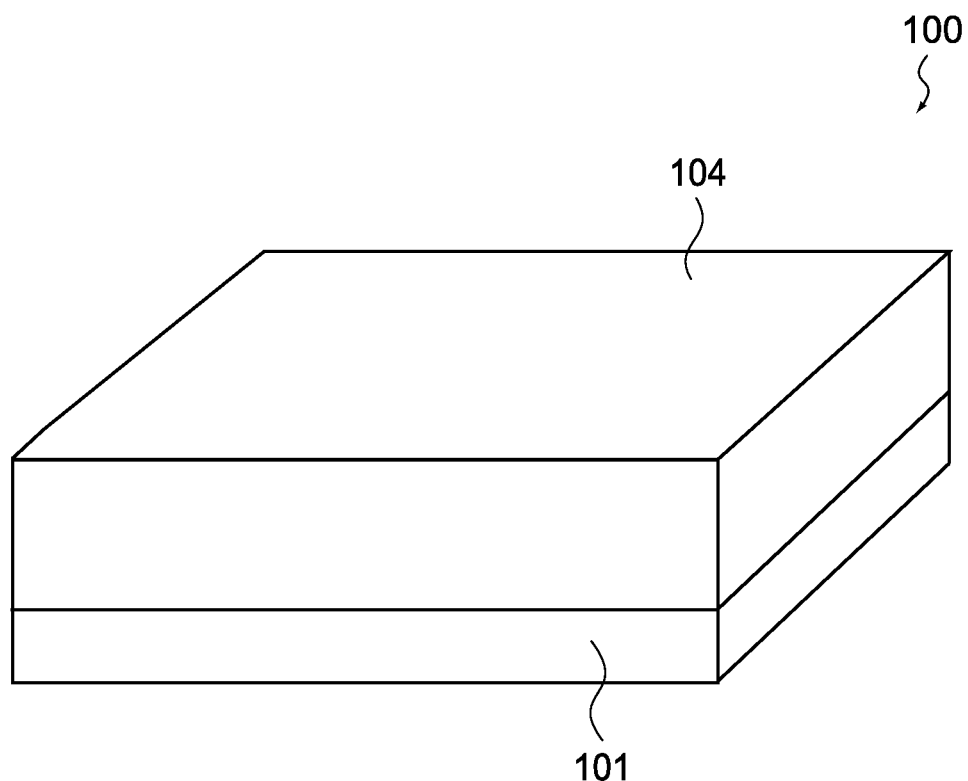
FIG. 1 is a perspective view of a circuit module according to a first embodiment of the present disclosure.

A circuit module according to an embodiment of the present disclosure includes a circuit substrate, a mount component, a sealing body, and a shield.

The circuit substrate includes a mount surface.

The mount component is mounted on the mount surface.

The sealing body is formed on the mount surface, covers the mount component and has a trench formed from a main surface of the sealing body to the mount surface.

The shield has an inner shield section formed within the trench and an outer shield section that covers the sealing body and the inner shield section. The outer shield section includes a first section having a flat surface formed on the main surface of the shielding body and a second section formed on the inner shield section and protruded or sagged from the first section.

By the circuit module, the second section of the outer shield section formed directly above the inner shield section and the trench can be visually recognized. In this way, the direction of the circuit module can be easily recognized. Also, it is easily recognized whether or not the inner shield section is present, thereby easily excluding defective products with no trench. In addition, a surface area of the shield can be increased by the second section as compared to the case that an entire surface of the shield is flat. It is thus possible to enhance heat dissipation and to inhibit defects of the mount module by heat.

For example, the second trench section may be protruded from the first section. In this way, if the shield is formed thin, a possibility that the sealing bodies are exposed can be decreased. Accordingly, a desirable shield effect can be stably maintained, and defects such as breakage can be inhibited.

The sealing body may be formed of an insulating sealing material including a thermosetting resin, and the shield may be a conductive shielding material including a thermosetting resin having a thermal expansion property different from the sealing material. In this way, the sealing material within the trench is expanded or shrunk against a surrounding shielding material by the heat treatment of the shielding material. It is thus possible to easily form the shield having the second section.

The shielding material may have a thermal expansion coefficient different from the sealing material. When the shielding material has the thermal expansion coefficient different from the sealing material, the thermal expansion properties of the shielding material and the sealing material can differ.

The shielding material may have a volume expansion rate different from the sealing material. When the shielding material has the volume expansion rate different from the sealing material, the thermal expansion properties of the shielding material and the sealing material can differ.

The thermal expansion property of the sealing material may be greater than that of the circuit substrate. In this way, the sealing material expands relative to the shielding material by the heat treatment of the shielding material. As a result, a distance between wall surfaces of the trench formed in the sealing material by the heat treatment can be narrowed to push the shielding material filed within the trench upward. Thus, the shield having the second section protruded can be easily formed.

The circuit module according to an embodiment of the present disclosure will be described.

[Configuration of Circuit Module]

Figure 2:
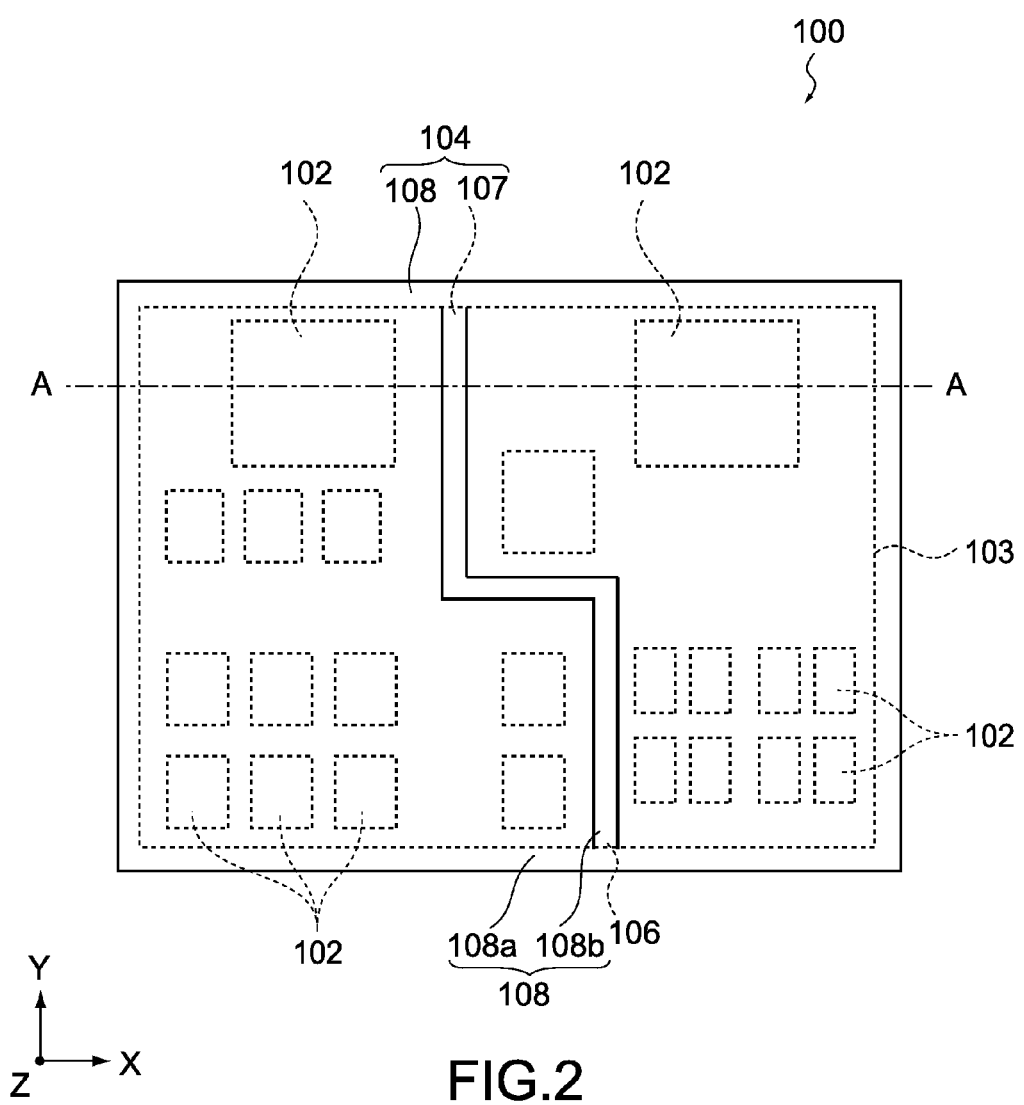
FIG. 2 is a plan view of the circuit module.
Figure 3:
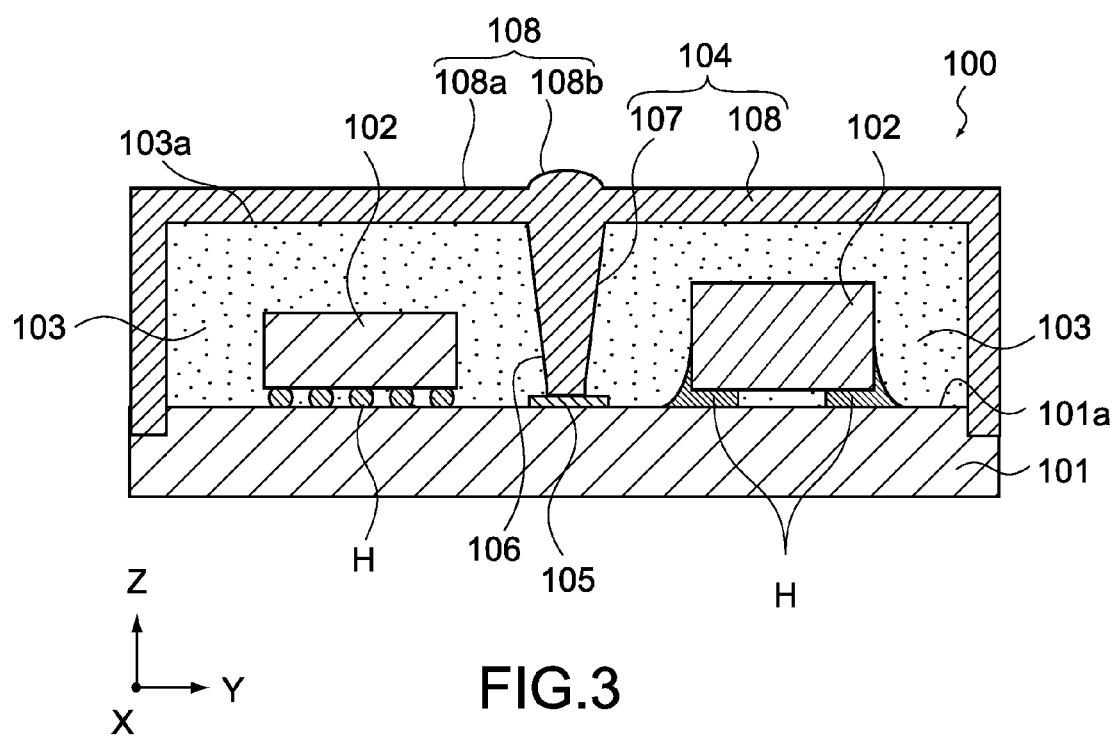
FIG. 3 is a sectional view of the circuit module (along the A-A line shown in FIG. 2)

FIG. 1 is a perspective view of a circuit module 100 according to an embodiment of the present disclosure. FIG. 2 is a plan view of the circuit module 100. FIG. 3 is a sectional view of the circuit module 100 along the A-A line in FIG. 2. In each view, an X axis direction, a Y axis direction and a Z axis direction are orthogonal to each other. The Z axis direction indicates a thickness direction (a vertical direction) of the circuit module. In the following description, a "planar view" is viewed from above (the Z axis direction).

As shown in FIGS. 1 to 3, the circuit module 100 includes a circuit substrate 101, mount components 102, sealing bodies 103, and a shield 104. In the circuit module 100, a plurality of mount components 102 are disposed on the circuit substrate 101, and the sealing bodies 103 and the shield 104 are formed to cover the mount components 102. Although a size or a shape of the circuit module 100 is not especially limited, the circuit module 100 may be a rectangular parallelepiped having a size of tens mm squares and a thickness of several mms, for example.

On the circuit substrate 101, the mount components 102 are mounted. The circuit substrate 101 can be a multi-layer substrate on which a plurality of layers made of an insulating material such as a glass epoxy-based material and an insulating ceramic material are laminated. Within the layers, interlayer wirings (not shown) are formed. Hereinafter, a surface of the circuit substrate 101 on a side where the mount components 102 are mounted is defined as a mount surface 101a.

On the mount surface 101a, a superficial conductor 105 is disposed, as shown in FIG. 3. The superficial conductor 105 may be a conductive paste coated and cured on the mount surface 101a or be a metal film formed by plating etc. on the mount surface 101a. The superficial conductor 105 can be disposed on the mount surface 101a along a trench 106 as described later.

The superficial conductor 105 is connected to the interlayer wirings (not shown) formed within the circuit substrate 101. The superficial conductor 105 may be electrically connected to a ground terminal of the circuit module 101 via the interlayer wirings such that the superficial conductor 105 can be maintained at a ground potential. Also, the superficial conductor 105 may be electrically connected to the mount components 102 via the interlayer wirings.

The mount component 102 mounted on the mount surface 101a of the circuit substrate 101 is an electronic component such as an integrated circuit (IC), a capacitor, an inductor, a resistor, a crystal oscillator, a duplexer, a filter, a power amplifier, and the like, for example. The mount component 102 can be mounted on the mount surface 101a by solder joint using solder H. As shown in FIG. 2, the plurality of mount components 102 can be mounted on the circuit substrate 101. The number or placement of mount components 102 is not especially limited.

The sealing body 103 is formed on the mount surface 101a and covers the mount components 102. In this embodiment, the sealing body 103 is formed of an insulating sealing material including a thermosetting resin. Specifically, the sealing material can be an epoxy resin to which silica or alumina is added. As an example, the material having a predetermined thermal expansion property greater than that of the circuit substrate 101 can be used. After the mount components 102 are mounted on the mount surface 101a, peripherals of the mount components 102 are filled with a fluid sealing material, and the sealing material is cured to provide the sealing body 103.

Figure 4:
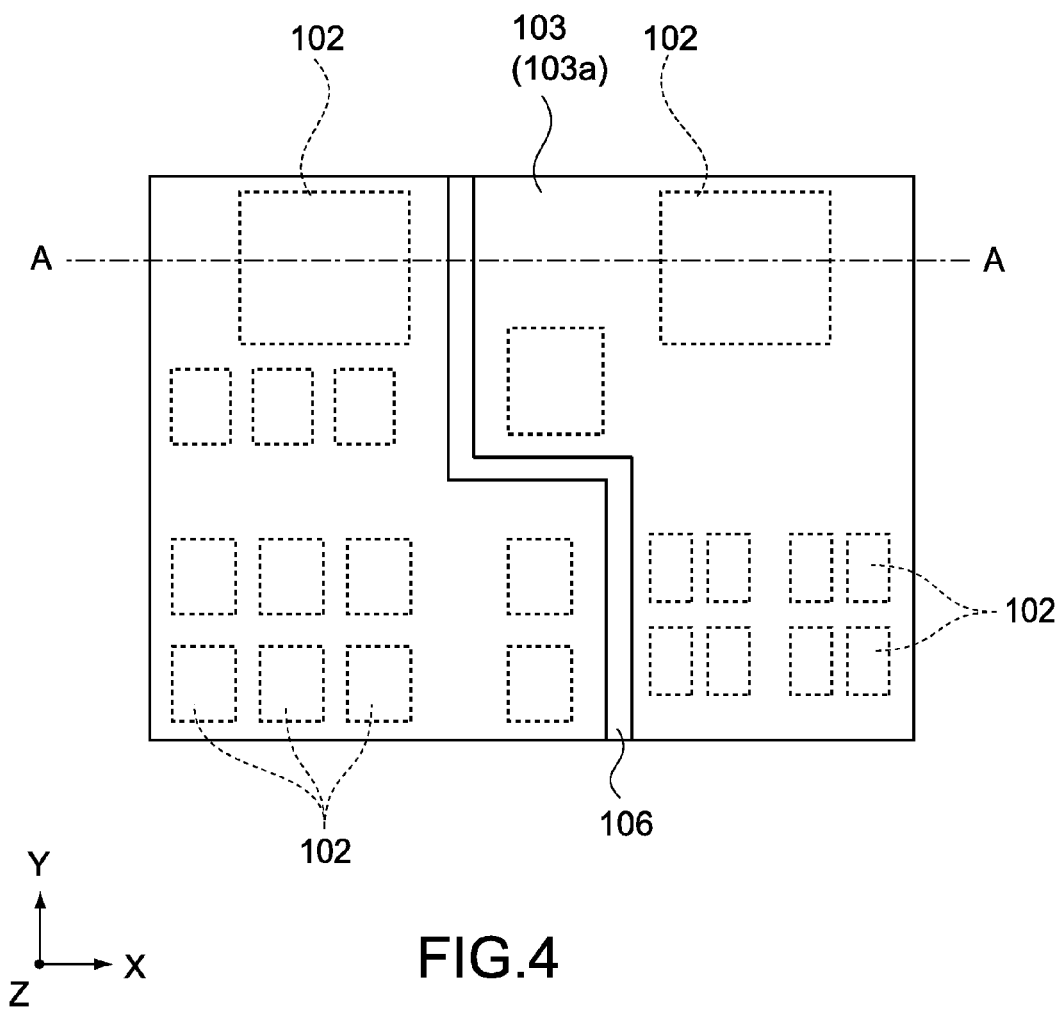
FIG. 4 is a plan view showing sealing bodies of the circuit module.
Figure 5:
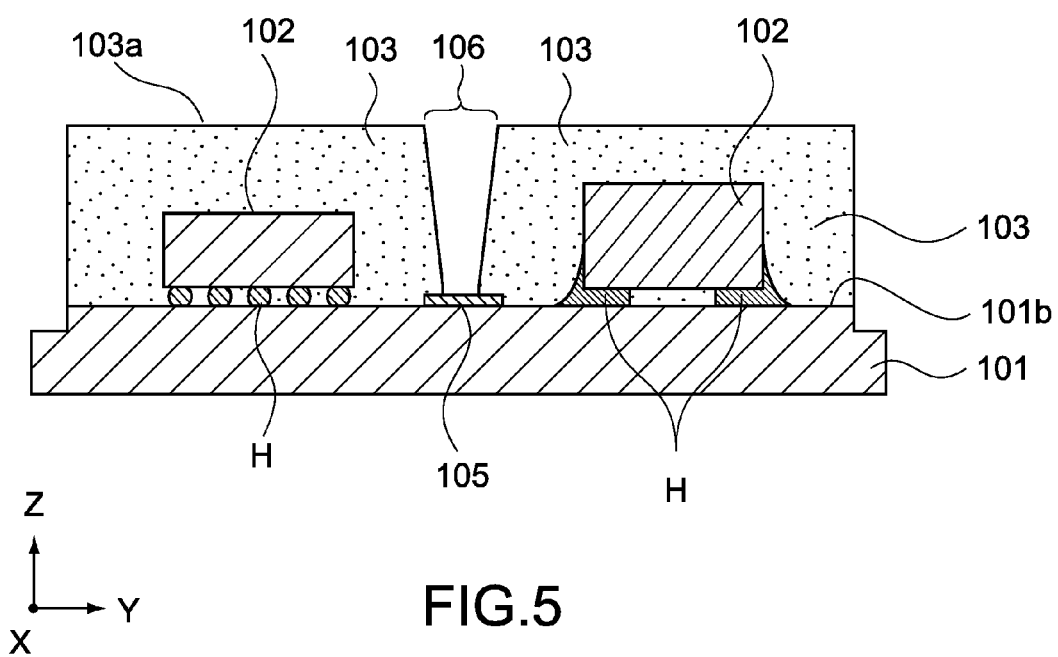
FIG. 5 is a sectional view of the circuit module.

FIG. 4 is a plan view showing the sealing bodies 103 by omitting the shield 104 shown in FIG. 2. FIG. 5 is a sectional view showing the sealing bodies 103 by omitting the shield 104 shown in FIG. 3. The sealing bodies 103 has the trench 106 formed from a main surface 103a to the mount surface 101a.

The trench 106 can be formed by removing the sealing bodies 103 in a groove shape. Wall surfaces of the trench may 106 have a cross-sectional shape of a taper to the mount surface 101a as shown in FIG. 5, or may be formed almost vertically to the mount surface 101a. A depth of the trench 106 is not especially limited, but can reach the superficial conductor 105.

The trench 106 has the shape shown in FIG. 4 in the planar view, and is formed between the plurality of mount components 102 such that the mount components 102 are separated. The shape of the trench 106 is not limited to that shown in FIG. 4, and may depend on types or positions of the mount components 102.

The shield 104 covers the sealing bodies 103, and functions as a shield against interruption induced by electromagnetic waves (electromagnetic interruption). According to this embodiment, the shield 104 is formed by a conductive shielding material including a thermosetting resin. The shielding material may be a conductive resin such as an epoxy resin containing conductive particles such as Ag and Cu, and can have different thermal expansion property from the sealing material. Herein, the thermal expansion property is a concept including a thermal expansion coefficient and a volume expansion rate. By differing the thermal expansion coefficients of the shielding material and the sealing material, the thermal expansion properties of both may be different. Also, by differing the volume expansion rates of the shielding material and the sealing material, the thermal expansion properties of both may be different.

The shield 104 has an inner shield section 107 formed within the trench 106 and an outer shield section 108 covering the sealing body 103 and the inner shield section 107, as shown in FIG. 3 etc.

The trench 106 is filled with a shielding material to form the inner shield section 107. The inner shield section 107 abuts on the superficial conductor 105 via the trench 106 as shown in FIG. 3, and is electrically connected to the superficial conductor 105.

On the other hand, the outer shield section 108 covers the whole sealing body 103 and the inner shield section 107. The outer shield section 108 has a first section 108a having a flat surface formed on the main surface 103a of the sealing body 103 and a second section 108b formed on the inner shield section 107.

As shown in FIG. 3, the second section 108b is protruded from the first section 108a and is formed directly above the trench 106 and the inner shield section 107.

Next, a method of producing the circuit module 100 will be described.

[Method of Producing Circuit Module]

FIGS. 6A to 6C and 7A to 7C each is a schematic view showing a method of producing the circuit module 100. The plurality of circuit modules 100 can be produced on one circuit substrate at the same time, and be divided into each circuit module 100. Hereinbelow, one of the circuit modules 100 will be described.

Figure 6A:
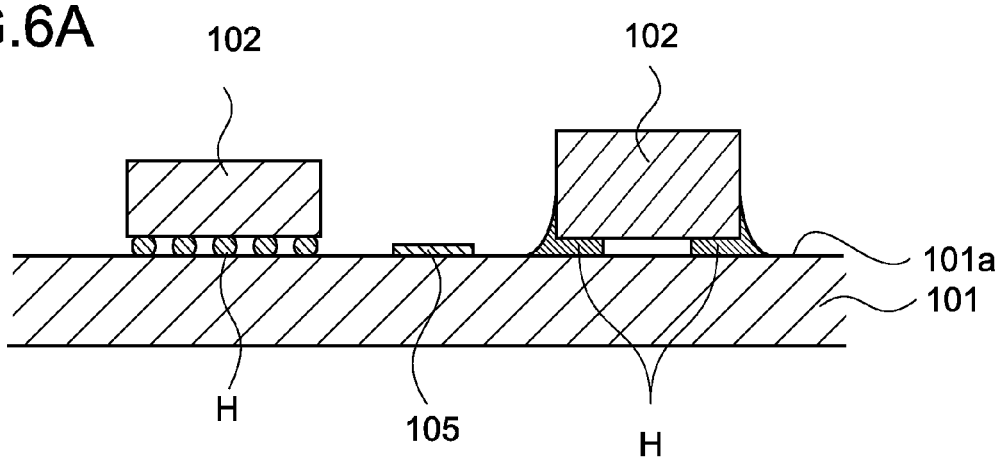
FIGS. 6A to 6C each is a schematic view showing a method of producing the circuit module.

As shown in FIG. 6A, the mount components 102 are mounted on the mount surface 101a of the circuit substrate 101. Mounting can be performed by a variety of mounting methods including solder joint. In this case, the superficial conductor 105 is disposed in advance on the mount surface 101a.

Figure 6B:
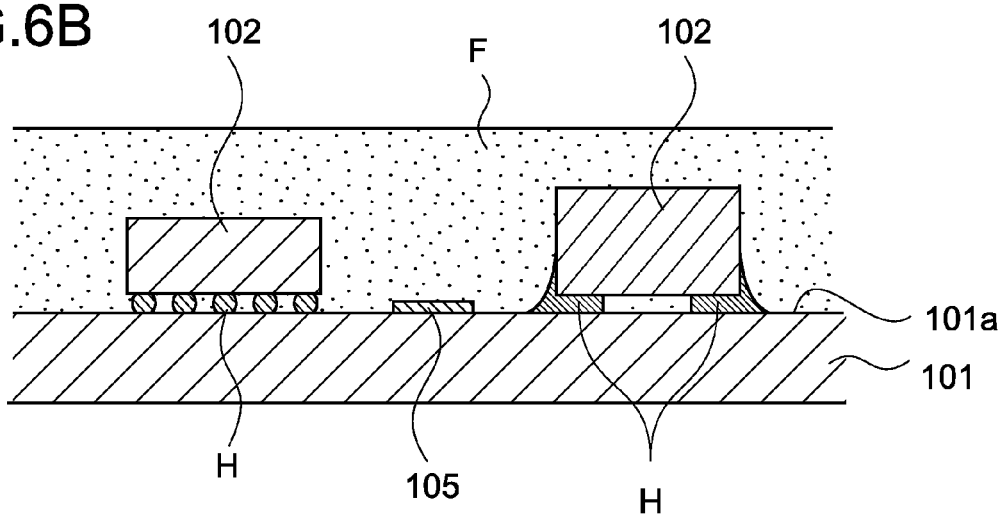

Next, as shown in FIG. 6B, the mount components 102 are coated and covered with a liquid or paste sealing material F on the mount surface 101a. Coating with the sealing material F can be performed by a vacuum printing method, a spin coating method or the like. After the mount surface 101a is coated with the sealing material F, the sealing material F is thermally treated, e.g., baked to be cured.

Figure 6C:
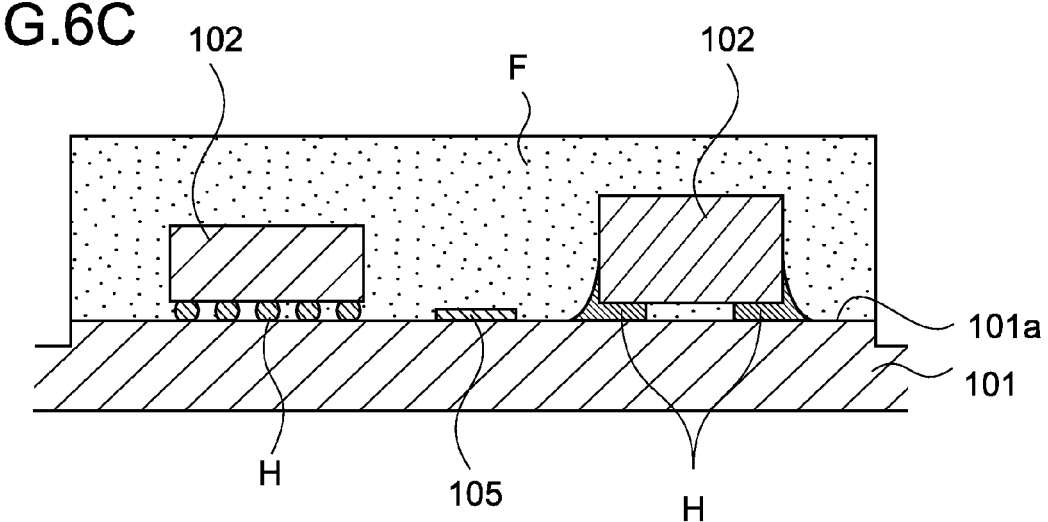

Next, as shown in FIG. 6C, the sealing material F is half-cut per the circuit module 100. For example, the sealing material F can be half-cut by a dicer.

Next, as shown in FIG. 7A, the sealing material F is irradiated with laser L and is scanned. Irradiation of the laser L removes linearly the sealing material F, and the sealing body 103 having the trench 106 shown in FIG. 7B is formed. The shape of the trench 106 can be adjusted as appropriate depending on an output of the laser, a scan speed and a scan path of the laser etc. For example, by adjusting the output and the scan speed of the laser, as shown in FIGS. 3 and 5, the trench 106 having a taper cross-section and reaching the superficial conductor 105 can be formed. Alternatively, by controlling the scan path of the laser, the trench 106 having a predetermined shape in the planar view as shown in FIG. 4 is formed. In addition, the trench 106 may be formed before half-cutting the sealing material F.

Then, the shield 104 is formed on the sealing bodies 103. In this step, as shown in FIG. 7C, the sealing bodies 103 are coated with a shielding material S using a vacuum printing method etc. In this way, entire surfaces of the sealing bodies 103 including the trench 106 are filled with the shielding material S. As the trench 106 reaches the superficial conductor 105 as described above, the shielding material S can reach the superficial conductor 105 in the trench 106.

Next, the shielding material S coated is thermally treated as predetermined, e.g., baked. The conditions for the thermal treatment can be determined depending on the properties of the shielding material. By the thermal treatment, the shielding material S is cured. As shown in FIG. 3, the shield 104 having the inner shield section 107 and the outer shield section 108 is formed.

In this case, the sealing material F of the sealing bodies 103 has different physical properties and thermal expansion property from the sealing material S of the shield 106. For example, the shielding material S has a different thermal expansion coefficient from that of the sealing material F under the predetermined thermal treatment conditions. The sealing material F and the shielding material S expand at a different rate. When the sealing material F has a greater thermal expansion coefficient than the shielding material S, the sealing material F expands relative to the shielding material S. In this way, the sealing material F expands to the shielding material S in wall surfaces of the trench 106, and the shielding material S filled within the trench 106 will be pushed upward. As a result, as shown in FIG. 3, the second section 108b protruded from the first section 108a having the flat surface is formed.

Also when the shielding material S has a different volume expansion rate from the sealing material F, i.e., when the sealing material F has a greater volume expansion rate than the shielding material S, the second section 108b protruded from the first section 108a can be formed.

In this embodiment, the thermal expansion property of the sealing material F is greater than that of the circuit substrate 101. Thus, the sealing material F expands relative to the circuit substrate F by the heat treatment to narrow the distance between the wall surfaces of the trench 106. It is possible to push out the shielding material S effectively.

Next, the shield 104 and the circuit substrate 101 are cut (full-cut) per circuit module 100. For example, the shield 104 and the circuit substrate 101 can be cut by the dicer. In this way, the circuit module 100 is produced.

[Advantages]

The circuit module 100 according to the embodiment has the following advantages. In other words, as shown in FIG. 2, among the outer shield section 108, the second section 108b that is an area above the trench 106 and the inner shield section 107 in the Z axis direction can be visually recognized. In this way, using the second section 108b as an index, it is possible to visually recognize a direction of the circuit module 100 from above the shield 104. Accordingly, it is possible to enhance a handling property when the circuit module 100 is mounted to other control substrate etc.

The second section 108b is formed corresponding to the trench 106. It is thus possible to visually recognize that the trench 106 is formed after the circuit module 100 is produced. In this way, a processing history of the trench 106 can be easily confirmed in an inspection before shipping the products, thereby easily recognizing defective products.

Figure 8:
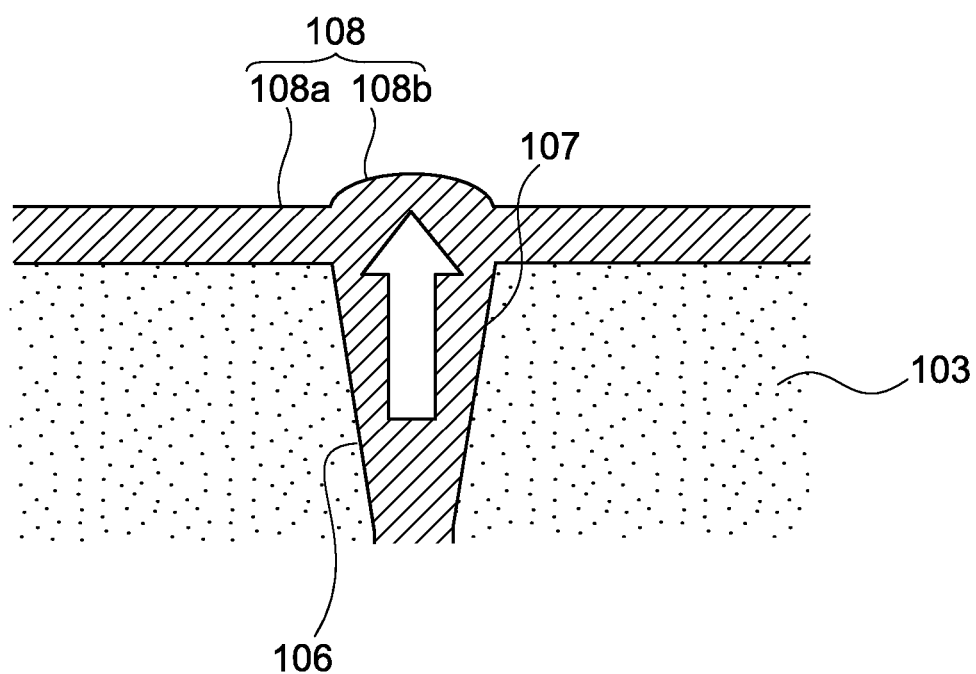
FIG. 8 is a schematic enlarged sectional view showing the circuit module.

FIG. 8 is a schematic enlarged sectional view showing the circuit module 100. A void arrow in FIG. 8 schematically shows a heat transmission within the inner shield 107. For example, when the mount components 102 generate heat, the heat is transmitted to the inner shield section 107 via the sealing bodies 103. As shown in FIG. 8, the heat is transmitted to the second section 108 of the outer shield section 108 and is diffused from the surface of the second section 108b. According to this embodiment, a surface area of the shield 104 can be increased as compared to the case that the whole shield 104 is flat. It is thus possible to enhance heat dissipation and to inhibit defects etc. of the mount components 102 by heat.

Figure 9A:
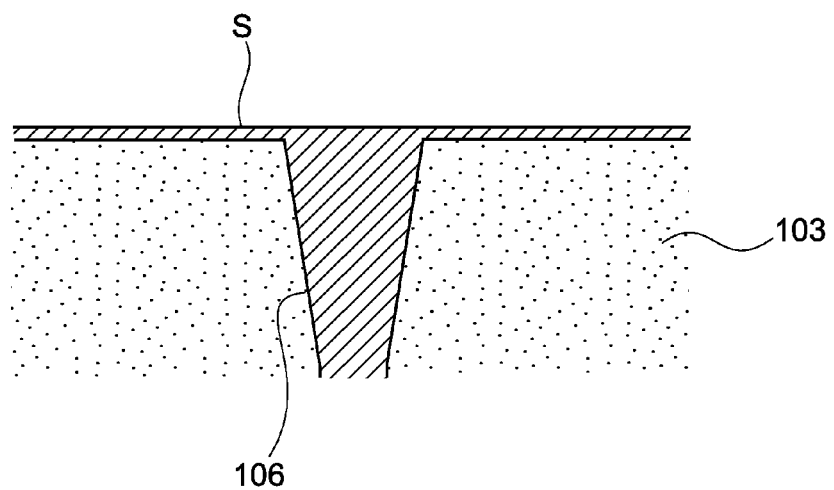
FIGS. 9A and 9B each is a schematic enlarged sectional view showing a reference example of the circuit module.
Figure 9B:
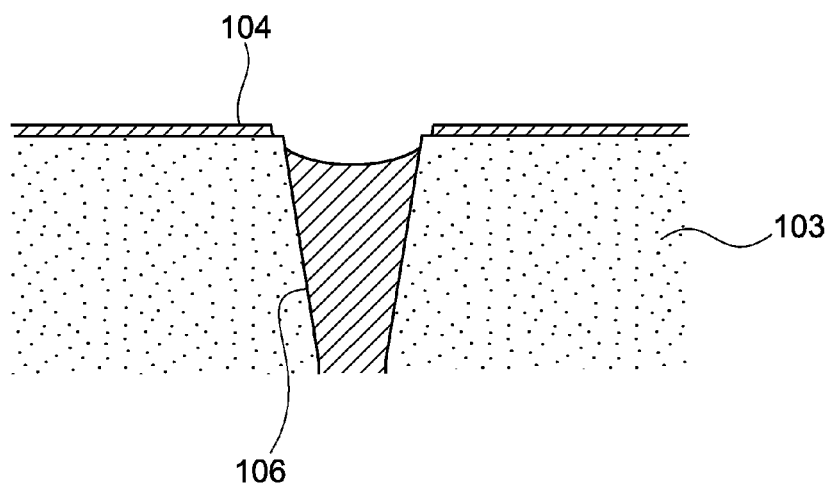

Furthermore, the second section 108b is configured as a convex portion, thereby decreasing a possibility that the sealing bodies 103 are exposed. FIGS. 9A and 9B each shows a shield 104a having no second section. As shown in FIG. 9A, the sealing bodies 103 are coated thin with the shielding material S. Then, the shielding material S may be shrunk by the heat treatment and corners of the sealing bodies 103 may be exposed as shown in FIG. 9B. According to the embodiment, the second section 108b is protruded from the first section 108a, thereby inhibiting the sealing bodies 103 from exposing. Accordingly, a desirable shield effect can be stably maintained, and defects of the circuit module 100 can be inhibited.

[Other Shapes of Second Section]

Figure 10:
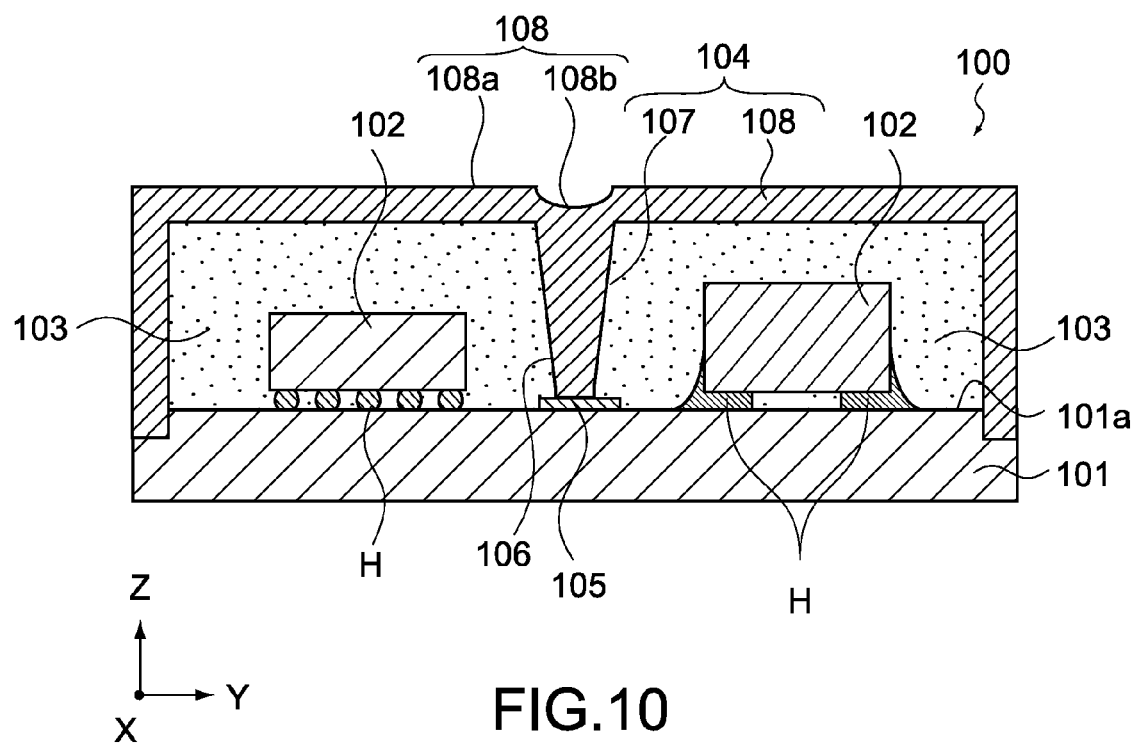
FIG. 10 is an enlarged sectional view showing other example of a second section of the circuit module.
Figure 11:
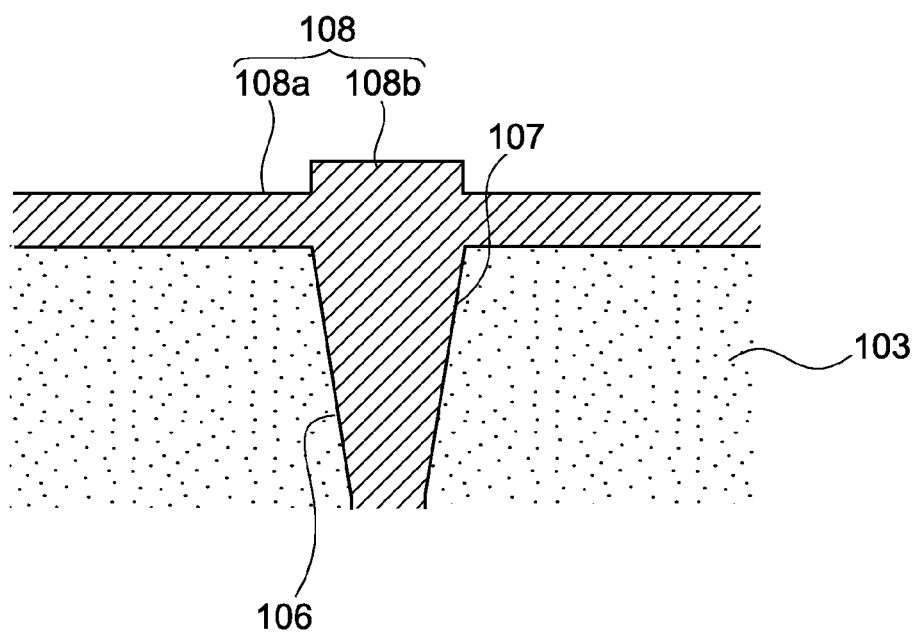
FIG. 11 is an enlarged sectional view showing other example of a second section of the circuit module.
Figure 12:
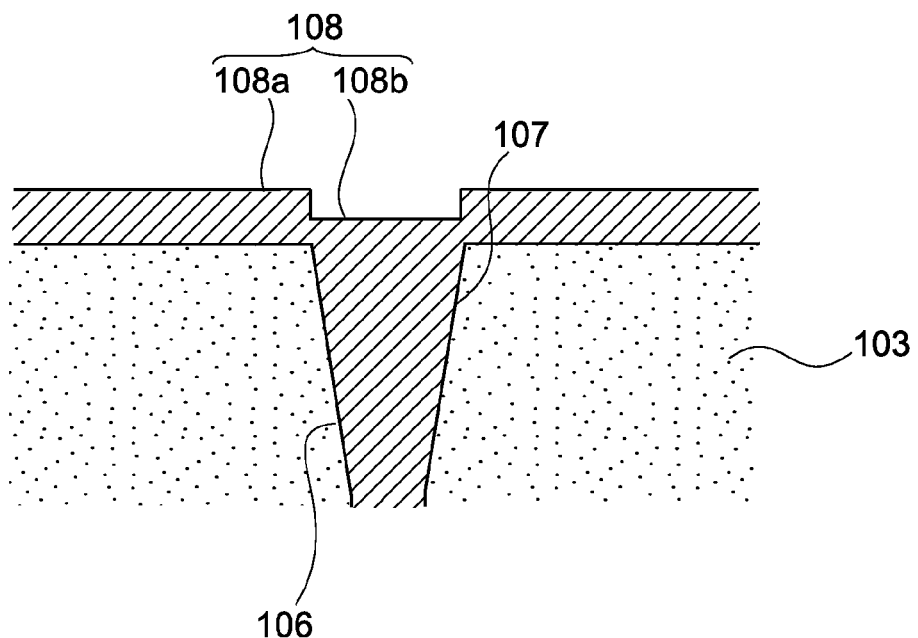
FIG. 12 is an enlarged sectional view showing other example of a second section of the circuit module.

FIGS. 10 to 12 each is a view showing other shape of the second section.

As shown in FIG. 10, the second section 108b may be a concave portion sagged from the first section 108a having the flat surface. This allows the direction of the circuit module 100 to be visually recognized from above the shield 104, as described above. In addition, it is possible to easily determine that the trench 106 is formed after the circuit module 100 is produced. Furthermore, the surface area of the shield 104 can be increased as compared to the shield having an approximate flat configuration, and it is possible to enhance heat dissipation generated from the mount components 102.

The sealing material and the shielding material of the circuit module 100 shown in FIG. 10 can include thermosetting resin, as described above. In this case, the thermal expansion property of the shielding material can be greater than that of the sealing material. Specifically, the shielding material can have a greater thermal expansion coefficient or a greater volume expansion rate than the sealing material. In this way, the sealing material is shrunk against the shielding material by the heat treatment in a step of forming the shield 104. It is thus possible to form the second section 108b sagged from the first section 108a.

FIG. 11 shows an example of the second section 108a protruded from the first section 108a not having a curved surface but having upper and side surfaces. FIG. 12 shows an example of the second section 108a sagged from the first section 108a not having a curved surface shown in FIG. 10 but having bottom and side surfaces. Further, the second section is not limited thereto, and may have a triangle cross-sectional shape.

[Alternative Embodiment]

In the above-described embodiments, the second section of the outer shield section is formed by the difference in the thermal expansion between the sealing material and the shielding material. However, it is not limited thereto. For example, after the shield having an approximate flat surface is formed, a concave portion or a convex portion may be formed via a mask having a shape corresponding to the trench. In this way, the shield having the second section protruded or sagged from the first section can also be formed.

In the above-described embodiments, both of the materials of the sealing body and the shield include the thermosetting resin. However, it is not limited thereto. For example, as the sealing material, a resin material other than the thermosetting resin can be used. As the shielding material, a metal material can be used.

While the embodiments of the present disclosure are described, it should be appreciated that the disclosure is not limited to the above-described embodiments, and variations and modifications may be made without departing from the spirit and scope of the present disclosure.

The present disclosure contains subject matter related to that disclosed in Japanese Priority Patent Application JP 2013-189176 filed in the Japan Patent Office on Sep. 12, 2013, the entire content of which is hereby incorporated by reference.

What is claimed is:

1. A circuit module, comprising:
    a circuit substrate having a mount surface and a superficial conductor being formed on the mount surface;
    a mount component mounted on the mount surface;
    a sealing body formed on the mount surface, the sealing body covering the mount component and having a trench formed from a main surface of the sealing body to the mount surface, the trench having two end portions being formed at two ends of the trench in a plane parallel with the mount surface; and
    a shield having an inner shield section formed within the trench and an outer shield section that covers the sealing body and the inner shield section, the outer shield section including a first section having a flat surface as an external surface, the first section formed on the main surface of the sealing body and a second section formed on the inner shield section and protruded outwardly away from the mount surface and from the flat surface of the first section, wherein
    the inner shield section and the outer shield section are formed integrally,
    a bottom of the trench is configured of a surface of the superficial conductor, and
    the two end portions of the trench reach an outer peripheral surface of the sealing body in the plane in parallel with the mount surface.

2. The circuit module according to claim 1, wherein
    the sealing body is formed of an insulating sealing material including a thermosetting resin, and
    the shield is a conductive shielding material including a thermosetting resin having a thermal expansion property different from the sealing material.

3. The circuit module according to claim 2, wherein
    the shielding material has a thermal expansion coefficient different from the sealing material.

4. The circuit module according to claim 2, wherein
    the shielding material has a volume expansion rate different from the sealing material.

5. The circuit module according to claim 1, wherein
    a thermal expansion property of the sealing material is greater than that of the circuit substrate.

* * * * *